United States Patent
Touky et al.

(10) Patent No.: US 6,514,664 B1
(45) Date of Patent: Feb. 4, 2003

(54) RADIATION SENSITIVE COMPOSITIONS CONTAINING IMAGE QUALITY AND PROFILE ENHANCEMENT ADDITIVES

(75) Inventors: Medhat A. Touky, Barrington, RI (US); Gail McCormick, Johnston, RI (US); Jacqueline M. Marshall, Tiverton, RI (US); Andrew J. Blakeney, Seekonk, MA (US)

(73) Assignee: Arch Specialty Chemicals, Inc., Norwalk, CT (US)

(*) Notice: Subject to any disclaimer, the term of this patent is extended or adjusted under 35 U.S.C. 154(b) by 0 days.

(21) Appl. No.: 09/620,384

(22) Filed: Jul. 20, 2000

(51) Int. Cl.$^7$ .............. G03F 7/004; G03F 7/26
(52) U.S. Cl. ............... 430/270.1; 430/283.1; 430/322; 430/920
(58) Field of Search ............. 430/270.1, 322, 430/920, 283.1

(56) References Cited

U.S. PATENT DOCUMENTS 4,609,620 A * 9/1986 Postle et al. .............. 430/554

(List continued on next page.)

*Primary Examiner*—Mark F. Huff
*Assistant Examiner*—Nicole Barreca
(74) *Attorney, Agent, or Firm*—Ohlandt, Greeley, Ruggiero & Perle, LLP

(57) ABSTRACT

The present invention is a radiation sensitive composition that includes a polymer resin, a photoacid generator, a solvent, and a heterocyclic additive selected from:

1-phenyl-2-pyrrolidinone and compound of the formulas (I), (II), (III), and (IV):

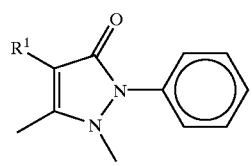

(I)

where $R^1$ is —H, —NH$_2$—, —OH, —N(CH$_3$)$_2$, —NH—CO—CH$_3$, or

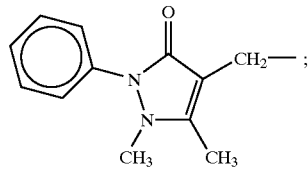

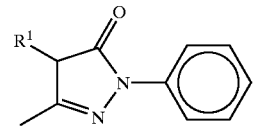
(II)

where $R^2$ is —CH$_3$ or benzoyl;

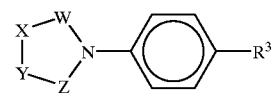

(III)

where $R^3$ is —H, or $C_1$–$C_4$ alkyl;
W, X, Y, and Z are each independently selected from —CH$_2$—,

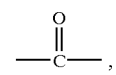

—CH(CH$_3$)—, —C(CH$_3$)$_2$—, —NH—, or —N(CH$_3$)—, with the proviso that at least one of W, X, Y, or Z is

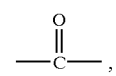

and at least one of W, X, Y, or Z is —NH— or —N(CH$_3$)—;

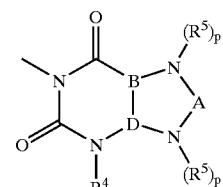

(IV)

where A is —CH= or

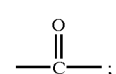

$R^4$ is —H, —CH$_3$, or —CH$_2$—CH(CH$_3$)$_2$;
$R^5$ is —H, —CH$_3$, or —CH$_2$—CH(OH)—CH$_2$(OH);
$R^6$ is —H;
B and D are identical and selected from

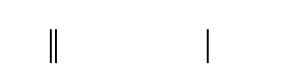

one p and q is 0 and the other p and q is 1, when A is —CH=; and
p and q are both 1, when A is

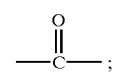

and mixtures thereof.

22 Claims, No Drawings

U.S. PATENT DOCUMENTS

| | | | | |
|---|---|---|---|---|
| 5,079,126 A | * | 1/1992 | Hipps, Jr. et al. | 430/138 |
| 5,178,998 A | * | 1/1993 | Maskasky et al. | 430/569 |
| 5,387,498 A | * | 2/1995 | Ellis | 430/353 |
| 5,468,589 A | | 11/1995 | Urano et al. | 430/170 |
| 5,558,978 A | | 9/1996 | Schadeli et al. | 430/270.1 |
| 5,565,306 A | * | 10/1996 | Meguro et al. | 430/341 |
| 5,665,522 A | * | 9/1997 | Vogel et al. | 430/278.1 |
| 5,843,624 A | | 12/1998 | Houlihan et al. | 430/296 |
| 5,858,583 A | * | 1/1999 | Dessauer et al. | 430/17 |
| 5,962,180 A | * | 10/1999 | Iwanaga et al. | 430/170 |
| 6,010,820 A | | 1/2000 | Aoai et al. | 430/270.1 |
| 6,156,481 A | * | 12/2000 | Takeda et al. | 430/270.1 |
| 6,280,902 B1 | * | 8/2001 | Yako et al. | 430/270.1 |
| 6,303,264 B1 | | 10/2001 | Fujie et al. | 430/270.1 |

\* cited by examiner

RADIATION SENSITIVE COMPOSITIONS CONTAINING IMAGE QUALITY AND PROFILE ENHANCEMENT ADDITIVES

BACKGROUND OF THE INVENTION

1. Field of the Invention

The present invention relates to radiation sensitive compositions. More particularly, the present invention relates to chemically amplified resist compositions containing image quality and profile enhancement additives.

2. Description of Related Art

The complexity of integrated circuit (IC) devices and computer chips has increased dramatically as greater demands are placed on the semiconductor industry. Integrated circuits and computer chips are now manufactured with smaller critical dimensions, requiring the photolithographic image patterns formed on wafers be less than 0.3 micron ($\mu$m) in resolution. To achieve this objective, photoresists used for photolithographic imaging are required to have better resolution, improved sensitivity, and more vertical profile than the state-of-the-art photoresists of a decade ago.

To obtain higher resolution patterns, chemically amplified photoresists are generally used. These chemically amplified photoresists utilize a combination of a selected polymer resin such as a partially modified or protected poly (hydroxystyrene) resin or copolymer of a partially modified hydroxystyrene with other monomers such as acrylates or methacrylates, a photoacid generating compound (PAG), and a selected solvent.

Semiconductor manufacturers, however, are always seeking ways to improve the resolution and profile image acuity of these photoresist compositions. Thus, the present invention provides a means to further improve the resolution of resist patterns and provide resist patterns with vertical side walls profiles and flat tops.

BRIEF SUMMARY OF THE INVENTION

The present invention provides a radiation sensitive composition comprising a polymer resin, a photoacid generator, a solvent, and a heterocyclic carbon and nitrogen containing additive selected from the group consisting of:

1-phenyl-2-pyrrolidinone and compounds of the formulas (I), (II), (III), and (IV):

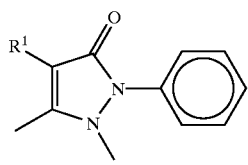
(I)

where $R^1$ is —H, —NH$_2$—, —OH, —N(CH$_3$)$_2$, —NH—CO—CH$_3$, or

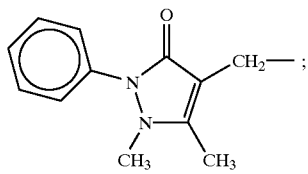

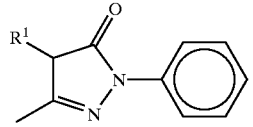
(II)

where $R^2$ is —CH$_3$ or benzoyl;

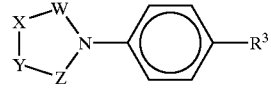
(III)

where $R^3$ is —H, or C$_1$–C$_4$ alkyl;
W, X, Y, and Z are each independently selected from
—CH$_2$—,

—CH(CH$_3$)—, —C(CH$_3$)$_2$—, —NH—, or —N(CH$_3$)—, with the proviso that at least one of W, X, Y, or Z is

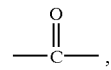

and at least one of W, X, Y, or Z is —NH— or —N(CH$_3$)—;

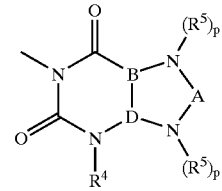
(IV)

where A is —CH= or

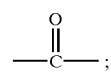

$R^4$ is —H, —CH$_3$, or —CH$_2$—CH(CH$_3$)$_2$;
$R^5$ is —H, —CH$_3$, or —CH$_2$—CH(OH)—CH$_2$(OH);
$R^6$ is —H;
B and D are identical and selected from

one p and q is 0 and the other p and q is 1, when A is —CH=; and p and q are both 1, when A is $$-\overset{\overset{\displaystyle O}{\|}}{C}-;$$

and mixtures thereof.

Optionally, the radiation sensitive composition may include one or more basic compounds in addition to the aforedescribed additives.

DETAILED DESCRIPTION OF THE INVENTION

The present inventors have discovered that inclusion of the specific heterocyclic additives in a radiation sensitive composition, i.e. a chemically amplified photoresist composition, will provide significantly improved resist patterns with crisper vertical side wall profiles, square corners, and flat tops.

The radiation sensitive composition contains a polymer resin, a photoacid generator, a solvent, and a heterocyclic additive.

Additives that are suitable for use in the present invention are, for example, compounds that have the formula shown in formulae (I), (II), and (III):

(I)

where $R^1$ is —H, —$NH_2$—, —OH, —$N(CH_3)_2$, —NH—CO—$CH_3$, or (II)

where $R^2$ is —$CH_3$ or benzoyl;

(III)

where $R^3$ is —H, or $C_1$–$C_4$ alkyl;
where W, X, Y, and Z are each independently selected from —$CH_2$—, $$-\overset{\overset{\displaystyle O}{\|}}{C}-,$$

—$CH(CH_3)$—, —$C(CH_3)_2$—, —NH—, or —$N(CH_3)$—, with the proviso that at least one of W, X, Y, or Z is $$-\overset{\overset{\displaystyle O}{\|}}{C}-,$$

and at least one of W, X, Y, or Z is —NH— or —$N(CH_3)$—.

Additives of the present invention also include, for example, compounds conforming to formula (IV):

(IV)

where A is —CH= or $$-\overset{\overset{\displaystyle O}{\|}}{C}-;$$

$R^4$ is —H, —$CH_3$, or —$CH_2$—$CH(CH_3)_2$;
$R^5$ is —H, —$CH_3$, or —$CH_2$—CH(OH)—$CH_2$(OH);
$R^6$ is —H;
B and D are identical and selected from $$-\overset{\overset{\displaystyle O}{\|}}{C}- \quad \text{or} \quad -\overset{\overset{\displaystyle |}{}}{CH}-;$$

one p and q is 0 and the other p and q is 1, when A is —CH=; and p and q are both 1, when A is $$-\overset{\overset{\displaystyle O}{\|}}{C}-.$$

Preferably, the additive compound is 1-phenyl-2-pyrolidinone or a compound of formulas (I), (II) and (III), selected from the group consisting of:

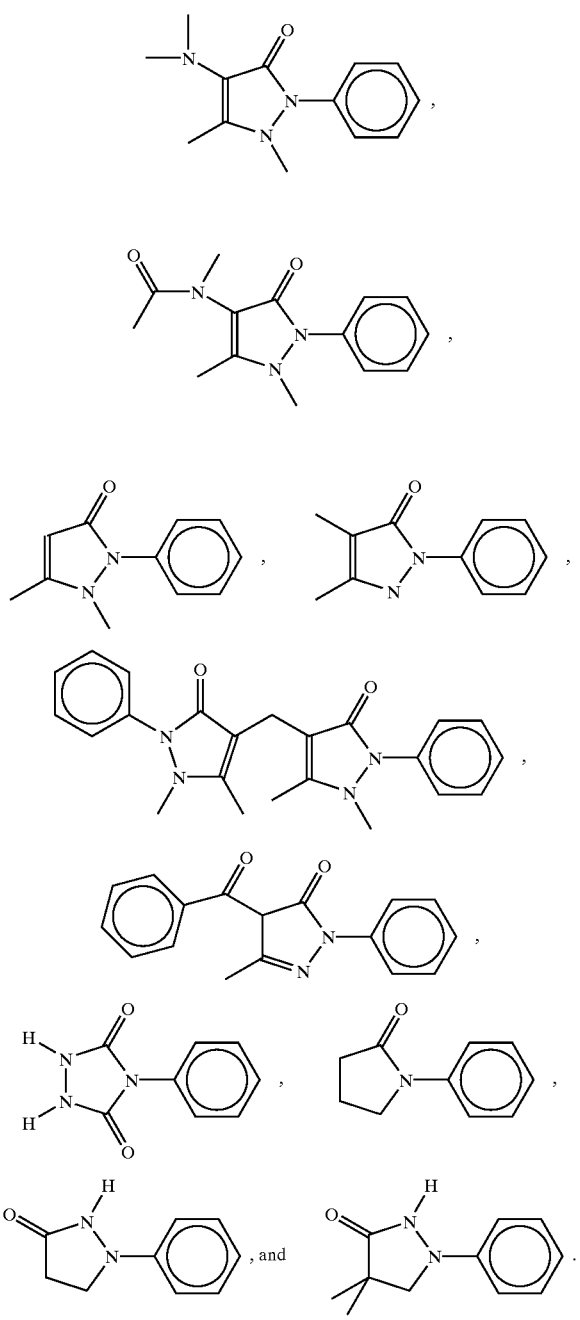

Preferably, the additive compound of formula (IV) is selected from the group consisting of:

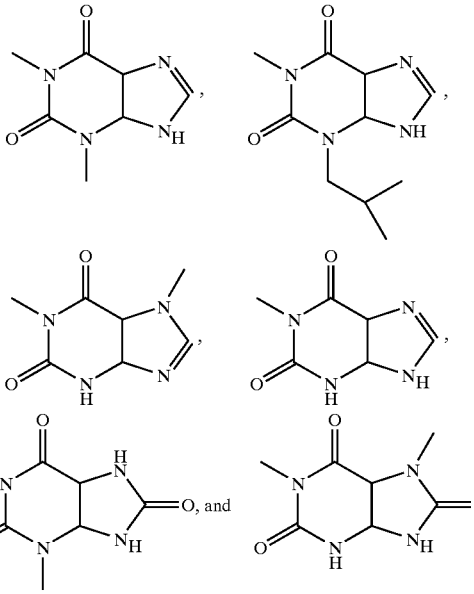

In the absence of a basic compound, the additive is included at about 0.01 to 20 parts by weight per 100 parts by weight of the photoacid generator used in the radiation sensitive composition. Preferably the additive is about 5 to 10 parts by weight, more preferably about 6 to 8 parts by weight per 100 parts by weight of the photoacid generator in the radiation sensitive composition, when the basic compound is not included.

Another essential component of the present composition is a polymer. The polymer may be a polymer or copolymer having one or more acid labile groups, capable of being released from the polymer in the presence of an acid to increase the solubility of the polymer in an alkaline developing solution can be used in the radiation sensitive composition of the present invention.

Polymers that are suitable are, for example, poly-1-cyclohexyl ethoxy/ethoxy styrene-co-hydroxy styrene, poly-1-cyclohexyl ethoxy/ethoxy styrene-co-hydroxy styrene-co-acetoxy styrene terpolymer, and poly-1-cyclohexyl ethoxy/ethoxy styrene-co-hydroxy styrene-co-t-butyl styrene terpolymer. The preferred polymer is poly-1-cyclohexyl ethoxy/ethoxy styrene-co-hydroxy styrene.

Additional polymers that may be used include, for example, polyhydroxystyrene and derivatives thereof. Preferred are those copolymers of polyhydroxystyrene and polyhydroxystyrene derivatives wherein hydrogen atoms of some OH groups of polyhydroxystyrene are replaced by any suitable acid labile groups. The acid labile group can be, for example, tert-butyl, tert-butoxycarbonyl, tert-butoxycarbonyl oxymethyl, and tetrahydropyranyl, methoxymethyl, trimethylsilyl, acetal groups, and tert-butyldimethylsilyl groups. The hydroxystyrene copolymers can be, for example, copolymers of hydroxystyrene and styrene, copolymers of hydroxystyrene and tert-butyl acrylate, copolymers of hydroxystyrene and tert-butyl methacrylate, copolymers of hydroxystyrene and tert-butyl vinyl benzoate, copolymers of hydroxystyrene and maleic anhydride, and copolymers of hydroxystyrene and di-tert-butyl maleate. The polyhydroxystyrene and derivatives thereof should preferably have a weight average molecular weight of about 5,000 to about 100,000.

Moreover, the polymer may be a copolymer containing an alicyclic moiety in a monomer. The alicyclic monomer can be substituted or unsubstituted. Such polymers are described in U.S. Pat. No. 5,843,624 and EP-0930541A1, which are incorporated herein by reference. For example, polymers such as norbornene, 1,5 cyclooctadiene, 1,5-dimethyl-1,5-cyclooctadiene, 5,6-dihydrodicyclopentadiene, and the like, may be used.

The present radiation sensitive composition includes a photoacid generator (PAG). The function of the PAG is to produce an acid upon exposure to radiation/photolysis, thereby increasing alkali solubility of the polymer resin by releasing acid-labile groups from the polymer.

Any suitable photoacid generator compound may be used in the photoresist composition. The photoacid generator compound may be, for example, onium salts such as diazonium, sulfonium, sulfoxonium and iodonium salts, sulfone compounds, sulfonate compounds, sulfonyloxyimide compounds, diazomethane compounds, and disulfone compounds. In addition, suitable photoacid generator compounds are disclosed in U.S. Pat. Nos. 5,558,978 and 5,468,589, which are incorporated herein by reference.

Sulfonium salts such as triphenylsulfonium perfluoro octane sulfonate and triphenylsulfonium perfluoro butane sulfonate are further examples of suitable photoacid generators. A comprehensive listing and description of sulfonium and iodonium photoacid generators that can be included in the present composition is found in U.S. Pat. No. 6,010,820, which is incorporated herein by reference.

Additional examples of suitable photoacid generators are phenacyl p-methylbenzenesulfonate, benzoin p-toluenesulfonate, α-(p-toluenesulfonyloxy) methylbenzoin 3-(p-toluenesulfonyloxy)-2-hydroxy-2-phenyl-1-phenylpropyl ether, N-(p-dodecylbenzenesulfonyloxy)-1,8-naphthalimide and N-(phenyl-sulfonyloxy)-1,8-napthalimide.

Other suitable photoacid generator compounds are o-nitrobenzaldehydes, which rearrange on actinic irradiation to give o-nitrosobenzoic acids such as 1-nitrobenzaldehyde and 2,6-nitrobenzaldehyde, α-haloacylphenones such as α,α, α-trichloroacetophenone and p-tert-butyl-α,α,α-trichloroacetophenone, and sulfonic esters of o-hydroxyacylphenones, such as 2-hydroxybenzophenone methanesulfonate and 2,4-hydroxybenzophenone bis (methanesulfonate).

Still other suitable examples of photoacid generators are triphenylsulfonium bromide, triphenylsulfonium chloride, triphenylsulfonium iodide, triphenylsulfonium hexafluorophosphate, triphenylsulfonium hexafluoroarsenate, triphenylsulfonium hexafluoroarsenate, triphenylsulfonium trifluoromethanesulfonate, diphenylethylsulfonium chloride, phenacyldimethylsulfonium chloride, phenacyltetrahydrothiophenium chloride, 4-nitrophenacyltetrahydrothiopheniumn chloride and 4-hydroxy-2-methylphenylhexahydrothiopyrylium chloride.

Further examples of suitable photoacid generators for use in this invention are bis(p-toluenesulfonyl)diazomethane, methylsulfonyl p-toluenesulfonyldiazomethane, 1-cyclohexylsulfonyl-1-(1,1-dimethylethylsulfonyl)diazometane, bis(1,1-dimethylethylsulfonyl)diazomethane, bis(1-methylethylsulfonyl)diazomethane, bis(cyclohexylsulfonyl) diazomethane, 1-p-toluenesulfonyl-1-cyclohexylcarbonyldiazomethane, 2-methyl-2-(p-toluenesulfonyl)propiophenone, 2-methanesulfonyl-2-methyl-(4-methylthiopropiophenone, 2,4-methyl-2-(p-toluenesulfonyl)pent-3-one, 1-diazo-1-methylsulfonyl-4-phenyl-2-butanone, 2-(cyclohexylcarbonyl-2-(p-toluenesulfonyl)propane, 1-cyclohexylsulfonyl-1-cyclohexylcarbonyldiazomethane, 1-diazo-1-cyclohexylsulfonyl-3,3-dimethyl-2-butanone, 1-diazo-1-(1, 1-dimethylethylsulfonyl)-3,3-dimethyl-2-butanone, 1-acetyl-1-(1-methylethylsulfonyl)diazomethane, 1-diazo-1-(p-toluenesulfonyl)-3,3-dimethyl-2-butanone, 1-diazo-1-benzenesulfonyl-3,3-dimethyl-2-butanone, 1-diazo-1-(p-toluenesulfonyl)-3-methyl-2-butanone, cyclohexyl 2-diazo-2-(p-toluenesulfonyl)acetate, tert-butyl 2-diazo-2-benzenesulfonylacetate, isopropyl-2-diazo-2-methanesulfonylacetate, cyclohexyl 2-diazo-2-benzenesulfonylacetate, tert-butyl 2 diazo-2-(p-toluenesulfonyl)acetate, 2-nitrobenzyl p-toluenesulfonate, 2,6-dinitrobenzyl p-toluenesulfonate, 2,4-dinitrobenzyl p-trifluoromethylbenzenesulfonate.

Other suitable examples of photogenerators are hexafluorotetrabromo-bisphenol A, 1,1,1-tris(3,5-dibromo-4-hydroxyphenyl)ethane and N-(2,4,6-tribromophenyl)-N'-(p-toluenesulfonyl)urea.

In the present invention, the photoacid generator is used at about 0.5 parts to 10 parts by weight per 100 parts of polymer. Preferably, the photoacid generator is included at about 2 to 5 parts, and more preferably about 3 to 4 parts by weight per 100 parts by weight of polymer in the photoresist composition.

The radiation sensitive composition of this invention also includes a solvent. The solvent should preferably be inert, should dissolve all components in the composition, should not undergo any chemical reaction with other components, and should be removed on drying after coating. Suitable solvents include, but are not limited to organic solvents, such as 2-methoxy-1-propylene acetate, γ-butyrolactone (GBL), diglyme, tetrahydrofuran (THF), propylene glycol monomethyl etheracetate (PGMEA), propylene glycol monomethylether (PGME), methyl ethyl ketone, methyl isobutyl ketone, 2-heptanone, cyclopentanone, cyclehexanone, 2-methoxyethanol, 2-ethoxyothanol, 2-ethoxyethyl acetate, 1-methoxy-2-propyl acetate, 1,2-dimethoxy ethane ethyl acetate, cellosolve acetate, propylene glycol monoethyl ether acetate, methyl lactate, ethyl lactate, methyl pyruvate, ethyl pyruvate, methyl 3-methoxypropionate, ethyl 3-methoxypropionate, 1,4-dioxane, ethylene glycol monoisopropyl ether, diethylene glycol monoethyl ether, diethylene glycol monomethyl ether, diethylene glycol dimethyl ether, and the like. The preferred solvent is propylene glycol monomethyl etheracetate.

Typically, the solvent is about 100 to 1000 parts by weight per 100 parts by weight of polymer in the photoresist composition. Preferably, about 200 to about 800 parts, and more preferably, about 400 to 700 parts by weight per 100 parts by weight of polymer in the photoresist composition is solvent.

Optionally, the composition of the present invention may include a basic compound. The basic compound functions to scavenge protons present in the radiation sensitive composition prior to being irradiated by the actinic radiation. The base prevents attack and cleavage of the acid labile groups by the undesirable acids thereby increasing the performance and stability of the resist. Suitable examples of basic compounds are, for example, 1,5-diazobicyclo[4.3.0]non-5-ene (DBN), 1,8-diazobicyclo[5.4.0]undec-7-ene (DBU), 2,4,5-triphenylimidazole, trimethylpropanetris(2-methyl-aziridinepropionate), 1-cyclohexyl-3-(2-morpholonoethyl)-2-thiourea, 2,8-dimethyl-6H,12H-5,11-methanodibenzo[b,f] [1,5]diazocine (Troger's Base), 1-amino-4-piperazine, 4-(3- aminopropyl)morpholine, 2-(aminophenyl)-6-methylbenzothiazole, tribenzylamine, 1,1,4,7,10,10-hexamethyltriethylenetetramine, thiomorpholine, 1,3-bis(3-pyridylmethyl)-2-thiourea, 4,4"-tetramethylenedipiperidine, aniline, N-methylaniline, N,N-dimethylaniline, o-toluidine, m-toluidine, p-toluidine, 2,4-lutidine, quinoline, isoquinoline, formamide, N-methyl-formamide, N,N-dimethylformamide, acetamide, N-methyl-acetamide, N,N-dimethylacetamide, 2-pyrrolidone, N-methylpyrrolidone imidazole, α-picoline, β-picoline, γ-picoline, 1,2-phenylenediamine, 1,3-phenylene-diamine, 1,4-phenylenediamine, 2-amino-4-nitrophenol, and triazines such as 2-(p-chloro-phenyl)-4,6-trichloromethyl-s-triazine, 1,3,5-tribenzylhexahydro-1,3,5-triazine, and mixtures thereof.

The basic compound and additive together are present in an amount of from about 1 to 20 parts by weight per 100 parts by weight of the photoacid generator used in the photoresist composition. Preferably the basic compound and additive are present in an amount of from about 5 to 10 parts by weight, more preferably about 6.5 to 7.5 parts by weight per 100 parts by weight of the photoacid generator in the photoresist composition.

The ratio of the basic compound to additive is about 95:5 to 30:70. Preferably the ratio of basic compound to additive is about 90:10 to 50:50, and most preferably the ratio is about 65:35 to 75:25.

The radiation sensitive composition may also include a dissolution inhibitor. The dissolution inhibitor is selected based upon the wavelength of the exposing radiation and the absorption characteristics of the particular dissolution inhibitor that will be used. For radiation wavelength exposure of 248 nm, napthoquinone diazide dissolution inhibitors are suitable. A more detailed description is provided in Reiser, A., Photoreactive Polymers: The Science and Technology of Resists, chapters 5 and 6 (John Wiley & Sons, pub. 1989) and Dammel, R., Diazonapthoquinone-based Resists, (SPIE Optical Engineering Press 1993), which are hereby incorporated by reference. For example, diazides such as napthoquinonediazide and a pentaester of a hexahydroxyspirobifluorene with napthoquinone-2-diazide-5-sulfonic acid are suitable dissolution inhibitors.

The radiation sensitive composition preferably includes about 10 to 35 weight percent of a dissolution inhibitor, where the molecular weight of the dissolution inhibitor is less than about 2000.

At 193 nm, the napthoquinone diazide dissolution inhibitors are even more absorbent and may absorb too strongly. As such, dissolution inhibitors that do not contain ethylenic saturation and are predominantly composed of alicyclic moieties are better suited at a radiation exposure wavelength of 193 nm. At 193 nm, suitable dissolution inhibitors include, for example, bile acid esters derived from cholic acid, deoxycholic acid, ursocholic acid, and lithocholic acid. U.S. Pat. No. 5,310,619 to Crivello et al. and U.S. Pat. No. 5,372,912 to Allen et al., describe the use of these dissolution inhibitors in lithographic process for device fabrication. Both of these patents are hereby incorporated by reference.

The present invention may further include one or more other components selected from the group consisting of surfactants, adhesion promoters, leveling agents, dyes, mixtures thereof, and the like.

Suitable surfactants include, for example, perfluoroalkylpolyoxyethylene ethanols and its ether and ester derivatives, fluorinated alkyl esters, perfluoroalkylamine oxides, and the like.

In addition, the present invention includes a process for forming a relief pattern using the composition of the present invention. The process comprises the steps of: (a) coating on a suitable substrate, a radiation sensitive composition comprising (i) a polymer resin, (ii) a photoacid generator, (iii) a solvent, (iv) a heterocyclic additive selected from the group consisting of compounds of formulas (I), (II), (III), (IV), and mixtures thereof, and (v) optionally, one or more basic compounds, forming a coated substrate; (b) baking the radiation sensitive composition; (c) imagewise exposing the coated substrate to actinic radiation; (d) post exposure baking the coated substrate at an elevated temperature; (e) developing the coated substrate with an aqueous developer, forming an imaged coated substrate; (f) rinsing the imaged coated substrate; and (g) drying the rinsed substrate.

The radiation sensitive composition of this invention is coated on any suitable substrate such as a silicon wafer, a ceramic substrate, or the like. Coating methods include, but are not limited to spray coating, spin coating, offset printing, roller coating, screen printing, extrusion coating, meniscus coating, curtain coating, and immersion coating. The resulting film may optionally be prebaked at an elevated temperature of about 60–170° C. for several minutes to half an hour, depending on the method, to evaporate the remaining solvent. Subsequently, the resulting dry film is imagewise exposed to actinic rays in a preferred pattern through a mask. X-rays, KrF-excimer laser, ArF-excimer laser, electron beam, ultraviolet, visible light, and the like can be used as actinic rays. The most preferable rays are those with wavelengths of about 248 nm or less.

Following exposure to actinic radiation, it is advantageous to heat the coated substrate to a temperature between about 60° C. and 200° C. The coated substrate is heated in this temperature range for a short period of time, typically several seconds to several minutes. This process step is commonly referred to in the art as post exposure baking.

The film is developed by an aqueous developer and a relief pattern is obtained. The aqueous developer includes a solution of alkali(s) such as an inorganic alkali (e.g., potassium hydroxide, sodium hydroxide, ammonia water), primary amines (e.g., ethylamine, n-propylamine), secondary amines (e.g. diethylamine, di-n-propylamine), tertiary amines (e.g., triethylamine), alcoholamines (e.g. triethanolamine), quaternary ammonium salts (e.g., tetramethylammonium hydroxide, tetraethylammonium hydroxide), and mixtures thereof. The most preferred developers are those containing tetramethylammonium hydroxide (TMAH). An appropriate amount of a surfactant can be added to the developer. Development can be carried out by means of immersion, spray, puddling, or other similar developing methods.

The relief pattern is then rinsed using deionized water.

To illustrate the present invention, the following examples are provided. It should be understood that the present invention is not limited to the examples described.

Synthesis Example 1

Preparation of poly-1-cyclohexylethoxy/ethoxystyrene-co-hydroxystyrene-co-acetoxystyrene-terpolymer A 1000 mL round-bottom, three-necked flask was equipped with a temperature probe, an overhead mechanical stirrer and a nitrogen inlet. 564 G of propylene gylcol monomethyl ether acetate (PGMEA) was charged into the flask. 90 G of powdered PHS (Nisso Corporation MW—15,000) was added to the stirring solvent. 19.2 G of cyclohexyl ethanol was added next. The mixture was stirred for 30 minutes to form a homogeneous solution. The solution was heated to 60° C. and vacuum was applied to distill 276 g of the solvent. The solution was allowed to cool to room temperature under a nitrogen atmosphere. 15.03 G of tertiary-butyl vinyl ether was added to the homogeneous solution, followed by 500 mg of solid pyridinium para-toluene sulfonate. A brief exotherm was observed, followed by a temperature rise of 25° C. to 32° C. The solution was then stirred at 23° C. for 2.5 hours. 24 g of triethylamine solution, prepared by dissolving 1 g of triethylamine in 99 g of PGMEA, was added to the reaction mixture to quench the acid. The reaction mixture was stirred for an additional 30 minutes. 2.99 G of pyridine was added. The mixture was stirred for 5 minutes and then 3.06 g of acetic anhydride was added. The mixture was then stirred at 23° C. for 2 hours. The polymer solution was transferred to a 2000 mL separatory funnel and treated with 345 g of acetone, 138 g of hexanes and 138 g of de-ionized water. The mixture was stirred briefly for 5 minutes and allowed to separate into two layers. The lower aqueous layer was discarded. The top organic layer was subjected to two more washings. In the second washing, 69 g of acetone, 21 g of PGMEA and 69 g of de-ionized water was used. In the third washing, 52 g of acetone, 21 g of PGMEA and 69 g of de-ionized water was used. The top organic layer was transferred to a 1000 mL round-bottom, three-necked flask. The flask was equipped with a temperature probe, an overhead stirrer and a vacuum distillation assembly. The flask was placed on a heating mantle. The organic volatiles from the polymer solution were removed by atmospheric distillation at 70° C. Final traces of low volatile solvents were removed by applying vacuum. The remaining polymer solution was diluted to a solids content of 30 weight percent.

A small portion of the solution was diluted with an equal volume of THF. The homogeneous solution was drop-wise added to ten-fold excess of hexanes. The white solid mass was recovered by filtration and dried in a vacuum oven at 45° C. for 12 hours. The solid sample was submitted for $^1$H and -$^{13}$C-NMR analysis for the determination of cyclohexylethyl acetal and acetoxy incorporation. Result: 13.2% cyclohexyl acetal and 8.6% acetoxy styrene.

Synthesis Example 2

Preparation of poly-1-cyclohexylethoxy/ethoxystyrene-co-hydroxystyrene Polymer

A 1000 mL round-bottom, three-necked flask was equipped with a temperature probe, an overhead mechanical stirrer and a nitrogen inlet. 564 G of propylene gylcol monomethyl ether acetate (PGMEA) was charged into the flask. 90 G of powdered PHS (Nisso Corporation MW—8000) was added to the stirring solvent. 20.77 G of cyclohexyl ethanol was added next. The mixture was stirred for 30 minutes to form a homogeneous solution. The mixture was heated to 60° C. and vacuum was applied to the solution to distill 276 g of the solvent. The solution was allowed to cool to room temperature under a nitrogen atmosphere. 20.28 G of tertiary-butyl vinyl ether was added to the homogeneous solution. 500 MG of solid pyridinium para-toluene sulfonate was added. A brief exotherm was observed, followed by a temperature rise of 25° C. to 32° C. The solution was stirred at 23° C. for 2.5 hours. 24 g of triethylamine solution, prepared by dissolving 1 g of triethylamine in 99 g of PGMEA, was added to the reaction mixture to quench the acid. The reaction mixture was stirred for an additional 30 minutes. The polymer solution was transferred to a 2000 mL separatory funnel and treated with 345 g of acetone, 138 g of hexanes and 138 g of de-ionized water. The mixture was stirred briefly for 5 minutes and allowed to separate into two layers. The lower aqueous layer was discarded. The top organic layer was subjected to two more washings. In the second washing, 69 g of acetone, 21 g of PGMEA and 69 g of de-ionized water was used. In the third washing, 52 g of acetone, 21 g of PGMEA and 69 g of de-ionized water was used. The top organic layer was transferred to a 1000 mL round-bottom, three-necked flask. The flask was equipped with a temperature probe, an overhead stirrer and a vacuum distillation assembly. The flask was placed on a heating mantle. The organic volatiles from the polymer solution were removed by atmospheric distillation at 70° C. Final traces of low volatile solvents were removed by applying vacuum. The remaining polymer solution was diluted to a solids content of 30 weight percent.

A small portion of the solution was diluted with an equal volume of THF. The homogeneous solution was drop-wise added to ten-fold excess of hexanes. The white solid mass was recovered by filtration and dried in a vacuum oven at 45° C. for 12 hours. The solid sample was submitted for $^1$H and -$^{13}$C-NMR analysis for the determination of cyclohexylethyl acetal. Result: 20.4% cyclohexyl acetal and 0% acetoxy styrene.

Synthesis Example 3

Preparation of poly-1-cyclohexylethoxy/ethoxystyrene-co-hydroxystyrene-co-acetoxystyrene-terpolymer Blend Solution Polymer solutions prepared in the manner explained in Synthesis Examples 1 and 2, were blended together at the weight ratio of 46.5% polymer of Synthesis Example 1 and 53.5% of the polymer in Synthesis Example 2, to provide one homogeneous solution of a polymer containing an average of 4% acetoxy styrene and 17% cyclohexyl acetal.

This polymer solution was used in the preparation of all the resist formulations provided in Examples 1 through 21.

EXAMPLES 1 THROUGH 11

Resist formulations were prepared using (a) 12.61 grams cyclohexylethyl-acetal locked polyhydroxystyrene polymer containing 4 mole % acetoxystyrene, (b) 0.39 grams PAG (triaryl sulfonium sulfonate), (c) 87.0 grams solvent (PGMEA) containing a leveling agent (FLUORAD FC-430—fluorocarbon based surfactant), and (d) 0.02489 grams of an Additive as indicated in Table 1.

TABLE 1

| Resist Example Number | Additive | Eo (mJ/cm.cm) | Gamma Value For 60" development |
|---|---|---|---|
| 1 | Antipyrine | 12.60 | 37.2800 |
| 2 | 4-Aminoantipyrine | 15.60 | 12.4500 |
| 3 | 4-Acetamidoantipyrine | 6.60 | 17.2300 |
| 4 | Caffeine | 4.80 | 16.1300 |
| 5 | 1,1'-carbonyldiimidazole | 10.80 | 3.8013 |
| 6 | 4-Dimethylaminoantipyrine | 13.80 | 15.6745 |
| 7 | 4,4-Dimethyl-1-phenyl-3-pyrazolidinone | 3.00 | 143.5100 |
| 8 | 4-Hydroxyantipyrine | 18.00 | (~100) |
| 9 | 1-Phenyl-2-pyrrolidinone | 3.00 | 9.4000 |
| 10 | 1-Phenyl-3-pyrazolidinone | 3.00 | 4.2200 |
| 11 | 4-Phenylurazole | 2.40 | 5.1200 |

Eo is a measurement of the minimum dose required for completely dissolving the resist in a large area in a given process in a given period of time. The gamma value is the slope of the line tangent to the curve in a plot of normalized film thickness remaining versus the log of the exposure dose.

EXAMPLES 12 THROUGH 21

Resist formulations were prepared using (a) 12.61 grams poly-1-cyclohexyl ethoxy/ethoxy styrene-co-hydroxy styrene polymer containing 4 mole % acetoxy styrene, (b) 0.39 grams PAG (triaryl sulfonium sulfonate), (c) 87.0 grams solvent (PGMEA) containing a leveling agent (FLUORAD FC-430—fluorocarbon based surfactant), and (d) a Base and Additive mixture as indicated in Table 2.

TABLE 2

| Resist Example Number | BASE and ADDITIVE Mixture | Base Weight | Eo (mJ/cm.cm) | Gamma For 60" Development |
|---|---|---|---|---|
| 12 | 70% DBN/30% Antipyrine | 0.01625 | 10.80 | 14.1248 |
| 13 | 70% DBN/30% 4-Aminoantipyrine | 0.028 | 19.80 | 12.3435 |
| 14 | 70% DBN/30% 4-Acetamido-antipyrine | 0.028 | 16.80 | 12.6629 |
| 15 | 70% DBN/30% Caffeine | 0.028 | 15.80 | 12.3654 |
| 16 | 70% DBN/30% 4-Dimethylaminoantipyrine | 0.028 | 19.20 | 8.1833 |
| 17 | 70% DBN/30% 4,4-Dimethyl-1-phenyl-3-pyrazolidinone | 0.028 | 15.40 | 11.8686 |
| 18 | 70% DBN/30% 4-Hydroxy-antipyrine | 0.028 | 17.60 | 9.6768 |
| 19 | 70% DBN/30% 1-Phenyl-2-pyrrolidinone | 0.02489 | 13.60 | 9.7230 |
| 20 | 70% DBN /30% 1-Phenyl-3-pyrazolidinone | 0.028 | 15.40 | 7.1807 |
| 21 | 100% DBN | 0.028 | 17.00 | 7.089 |

In general, the lithographic results were proportional in profile quality to the gamma values shown in Table 2. The formulation used in example 12 provided the best image profiles with vertical side walls that are steeper than any other formulation. In example 15, the formulation produced flat tops and steeper profiles than the formulation of example 21, which did not contain an additive of this invention.

The present invention has been described with particular reference to the preferred forms thereof. It will be obvious to one of ordinary skill in the art that changes and modifications may be made therein without departing from the spirit and scope of the present invention as defined by the following claims.

What is claimed is:

1. A radiation sensitive chemically amplified photoresist composition wherein the improvement comprises the inclusion in the composition of a heterocyclic additive selected from the group consisting of: 1-phenyl-2-pyrrolidinone and compounds of the formulas (I), (II), (III), and (IV):

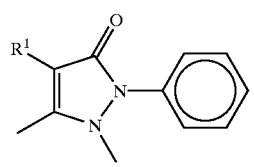
(I)

where $R^1$ is —H, —$NH_2$—, —OH, —$N(CH_3)_2$, —NH—CO—$CH_3$, or

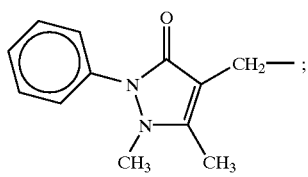

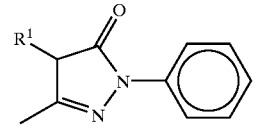
(II)

where $R^2$ is —$CH_3$ or benzoyl;

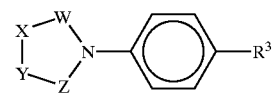
(III)

where $R^3$ is —H, or $C_1$-$C_4$ alkyl;

W, X, Y, and Z are each independently selected from —$CH_2$—,

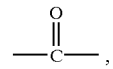

—CH($CH_3$)—, —C($CH_3$)$_2$—, —NH—, or —N($CH_3$)—, with the proviso that at least one of W, X, Y, or Z is

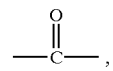

and at least one of W, X, Y, or Z is —NH— or —N($CH_3$)—;

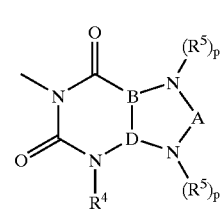
(IV)

where A is —CH= or

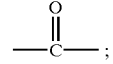

$R^4$ is —H, —$CH_3$, or —$CH_2$—CH($CH_3$)$_2$;
$R^5$ is —H, —$CH_3$, or —$CH_2$—CH(OH)—$CH_2$(OH);
$R^6$ is —H;

B and D are identical and selected from

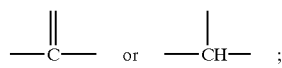

one p and q is 0 and the other p and q is 1, when A is —CH=; and
p and q are both 1, when A is

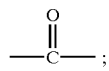

and mixtures thereof.

2. A radiation-sensitive chemically amplified photoresist composition comprising:
   a chemically amplified photoresist polymer resin;
   a photoacid generator;
   a solvent, and
   a heterocyclic additive selected from the group consisting of: 1-phenyl-2-pyrrolidinone and compounds of formulas (I), (II), (III), and (IV):

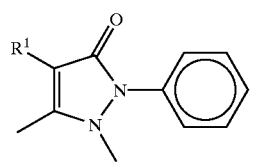
(I)

where $R^1$ is —H, —$NH_2$—, —OH, —$N(CH_3)_2$, —NH—CO—$CH_3$, or

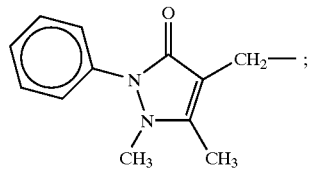
(II)

where $R^2$ is —$CH_3$ or benzoyl;

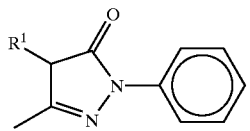
(III)

where $R^3$ is —H, or $C_1$–$C_4$ alkyl;
W, X, Y, and Z are each independently selected from —$CH_2$—,

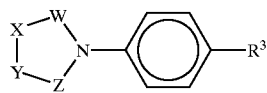

—CH($CH_3$)—, —C($CH_3$)$_2$—, —NH—, or —N($CH_3$)—, with the proviso that at least one of W, X, Y, or Z is

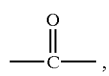

and at least one of W, X, Y, or Z is —NH— or —N($CH_3$)—;

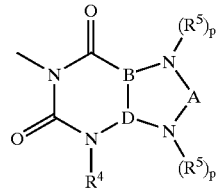
(IV)

where A is —CH= or

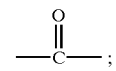

$R^4$ is —H, —$CH_3$, or —$CH_2$—CH($CH_3$)$_2$;
$R^5$ is —H, —$CH_3$, or —$CH_2$—CH(OH)—$CH_2$(OH);
$R^6$ is —H;
B and D are identical and selected from

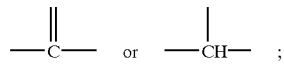

one p and q is 0 and the other p and q is 1, when A is —CH=; and
p and q are both 1, when A is

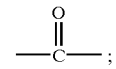

and mixtures thereof.

3. The composition of claim 2, wherein said additive is selected from the group consisting of:

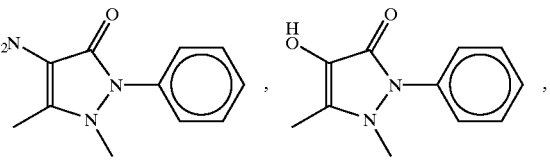

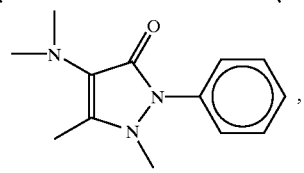

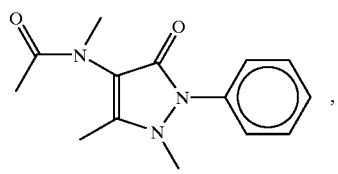

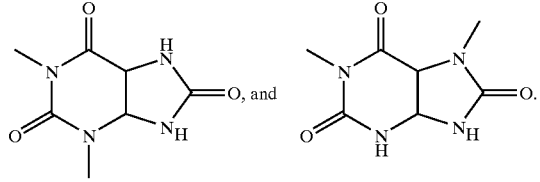

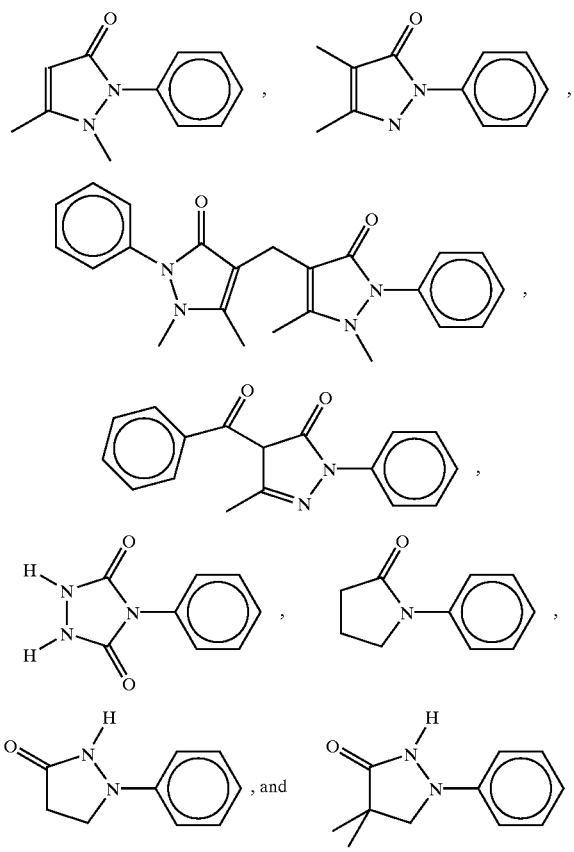

4. The composition of claim 2, wherein said additive is selected from the group consisting of:

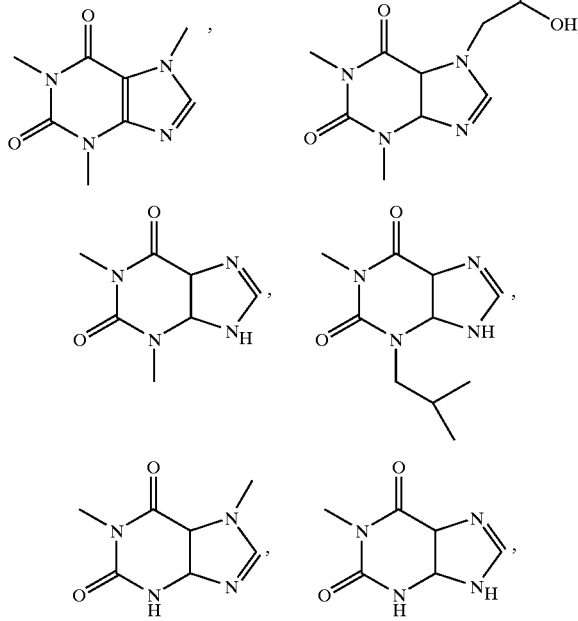

5. The composition of claim 2, wherein said additive is about 0.01 to 20 parts by weight per 100 parts by weight of said photoacid generator.

6. The composition of claim 2, wherein said polymer comprises cyclohexylethyl-acetal blocked polyhydroxystyrene.

7. The composition of claim 2, wherein said photoacid generator is selected from the group consisting of: onium salts, sulfone compounds, sulfonate compounds, sulfonyloxyimide compounds, diazomethane compounds, disulfones, and mixtures thereof.

8. The composition of claim 2, wherein said photoacid generator is a triaryl sulfonium sulfonate.

9. The composition of claim 2, wherein said photoacid generator is about 0.5 parts to 10 parts by weight per 100 parts by weight of said polymer.

10. The composition of claim 2, wherein said solvent is selected from the group consisting of 2-methoxy-1-propylene acetate, γ-butyrolactone, diglyme, tetrahydrofuran, propylene glycol monomethyl etheracetate, propylene glycol monomethylether, methyl ethyl ketone, methyl isobutyl ketone, 2-heptanone, cyclopentanone, cyclehexanone, 2-methoxyethanol, 2-ethoxyethanol, 2-ethoxyethyl acetate, 1-methoxy-2-propyl acetate, 1,2-dimethoxy ethane ethyl acetate, cellosolve acetate, propylene glycol monoethyl ether acetate, methyl lactate, ethyl lactate, methyl pyruvate, ethyl pyruvate, methyl 3-methoxypropionate, ethyl 3-methoxypropionate, 1,4-dioxane, ethylene glycol monoisopropyl ether, diethylene glycol monoethyl ether, diethylene glycol monomethyl ether, diethylene glycol dimethyl ether, and mixtures thereof.

11. The composition of claim 10, wherein said solvent is propylene glycol monomethyl etheracetate.

12. The composition of claim 2, wherein said solvent is about 100 to 1000 parts by weight per 100 parts by weight of polymer in the radiation sensitive composition.

13. The composition of claim 2, further comprising a basic compound.

14. The composition of claim 13, wherein said basic compound is selected from the group consisting of 1,5-diazobicyclo[4.3.0]non-5-ene, 1,8-diazobicyclo[5.4.0] undec-7-ene, 2,4,5-triphenylimidazole, trimethylpropanetris (2-methyl-aziridinepropionate), 1-cyclohexyl-3-(2-morpholonoethyl)-2-thiourea, 2,8-dimethyl-6H,12H-5,11-methanodibenzo[b,f][1,5]diazocine, 1-amino-4-piperazine, 4-(3-aminopropyl)morpholine, 2-(aminophenyl)-6-methylbenzothiazole, tribenzylamine, 1,1,4,7,10,10-hexamethyltriethylenetetramine, thiomorpholine, 1,3-bis(3-pyridylmethyl)-2-thiourea, 4,4"-tetramethylenedipiperidine, aniline, N-methylaniline, N,N-dimethylaniline, o-toluidine, m-toluidine, p-toluidine, 2,4-lutidine, quinoline, isoquinoline, formamide, N-methyl-formamide, N,N-dimethylformamide, acetamide, N-methyl-acetamide, N,N-dimethylacetamide, 2-pyrrolidone, N-methylpyrrolidone imidazole, α-picoline, β-picoline, γ-picoline, 1,2-phenylenediamine, 1,3-phenylene-diamine, 1,4-phenylenediamine, 2-amino-4-nitrophenol, and triazines such as 2-(p-chloro-phenyl)-4,6-trichloromethyl-s-triazine, 1,3,5-tribenzylhexahydro-1,3,5-triazine, and mixtures thereof.

15. The composition of claim 13, wherein said composition has a ratio of basic compound to additive of about 95:5 to 30:70.

16. The composition of claim 13, wherein said basic compound and said additive are about 1 to 20 parts by weight per 100 parts by weight of said photoacid generator.

17. The composition of claim 13, wherein said basic compound is 1,5-diazobicyclo[4.3.0]non-5-ene and said additive is antipyrine, wherein said composition has a ratio of basic compound to additive of about 70:30.

18. The composition of claim 2, further comprising a dissolution inhibitor.

19. The composition of claim 2, further comprising:
at least one component selected from the group consisting of surfactants, adhesion promoters, leveling agents, dyes, and mixtures thereof.

20. A process for forming a relief pattern, comprising the steps of:
a) coating on a substrate, the radiation sensitive composition of claim 2, forming a coated substrate;
b) baking said coated substrate;
c) imagewise exposing said coated substrate to actinic radiation;
d) post exposure baking said coated substrate at an elevated temperature;
e) developing said coated substrate with an aqueous developer, forming an imaged coated substrate;
f) rinsing said imaged coated substrate; and
g) drying said rinsed substrate.

21. The method of claim 20, wherein said radiation sensitive composition further comprises a basic compound.

22. The method of claim 21, wherein said basic compound is selected from the group consisting of 1,5-diazobicyclo[4.3.0]non-5-ene, 1,8-diazobicyclo[5.4.0]undec-7-ene, 2,4,5-triphenylimidazole, trimethylpropanetris(2-methylaziridinepropionate), 1-cyclohexyl-3-(2-morpholonoethyl)-2-thiourea, 2,8-dimethyl-6H,12H-5,11-methanodibenzo[b,f][1,5]diazocine, 1-amino-4-piperazine, 4-(3-aminopropyl)morpholine, 2-(aminophenyl)-6-methylbenzothiazole, tribenzylamine, 1,1,4,7,10,10-hexamethyltriethylenetetramine, thiomorpholine, 1,3-bis(3-pyridylmethyl)-2-thiourea, 4,4"-tetramethylenedipiperidine, aniline, N-methylaniline, N,N-dimethylaniline, o-toluidine, m-toluidine, p-toluidine, 2,4-lutidine, quinoline, isoquinoline, formamide, N-methyl-formamide, N,N-dimethylformamide, acetamide, N-methyl-acetamide, N,N-dimethylacetamide, 2-pyrrolidone, N-methylpyrrolidone imidazole, α-picoline, β-picoline, γ-picoline, 1,2-phenylenediamine, 1,3-phenylene-diamine, 1,4-phenylenediamine, 2-amino-4-nitrophenol, and triazines such as 2-(p-chloro-phenyl)-4,6-trichloromethyl-s-triazine, 1,3,5-tribenzylhexahydro-1,3,5-triazine, and mixtures thereof.

* * * * *